United States Patent [19]
Habu et al.

[11] Patent Number: 5,322,588
[45] Date of Patent: Jun. 21, 1994

[54] METHOD FOR PRODUCING KTIOPO4 SINGLE CRYSTAL

[75] Inventors: Kazutaka Habu, Tokyo; Tsutomu Okamoto, Kanagawa; Koichi Aso, Kanagawa; Koichi Tatsuki, Kanagawa, all of Japan

[73] Assignee: Sony Corporation, Tokyo, Japan

[21] Appl. No.: 921,230

[22] Filed: Jul. 29, 1992

[30] Foreign Application Priority Data

Aug. 3, 1991 [JP] Japan ............................ 3-17808
Jan. 31, 1992 [JP] Japan ............................ 4-041963

[51] Int. Cl.$^5$ ............................................. C30B 17/00
[52] U.S. Cl. ........................ 117/3; 156/623 R; 117/29; 117/36; 117/941
[58] Field of Search ....... 156/600, 601, 602, DIG. 70, 156/DIG. 71; 437/115, 170, 171, 172

[56] References Cited

U.S. PATENT DOCUMENTS

| | | | |
|---|---|---|---|
| 2,842,467 | 7/1958 | Lundauer et al. | 156/602 |
| 4,087,313 | 5/1978 | Milstein | 156/617.1 |
| 4,231,838 | 11/1980 | Gier | 156/600 |
| 4,620,897 | 11/1986 | Nakajima | 156/602 |
| 4,746,396 | 5/1988 | Marnier | 156/DIG. 70 |
| 5,084,248 | 1/1992 | Takenaka | 156/615.1 |

Primary Examiner—Olik Chaudhuri
Assistant Examiner—Felisa Garrett
Attorney, Agent, or Firm—Hill, Steadman & Simpson

[57] ABSTRACT

A method is provided for producing a KTiOPO4 which is grown at a temperature higher than its Curie temperature using a TSSG method. The grown KTiOPO4 single crystal is maintained in contact with a melt while the crystal is maintained at a temperature higher than the Curie temperature. A d.c. current is applied in this state across a seed crystal and the melt, while the single crystal is cooled to a temperature lower than the Curie temperature. The value of current density D, defined by the formula $D = I_p/(a+b)$, where $I_p$ is the impressed current and a, b are crystal sizes along a and b axes, respectively, is selected to be $0.01 \text{ mA/cm}^2 \leq D \leq 1.0 \text{ mA/cm}^2$. In this manner, the produced KTiOPO4 is processed into a single domain crystal.

6 Claims, 2 Drawing Sheets

METHOD FOR PRODUCING KTIOPO4 SINGLE CRYSTAL

BACKGROUND OF THE INVENTION

1. Field of the Invention

This invention relates to a method for producing a KTiOPO$_4$ single crystal employed as a non-linear optical material.

2. Description of the Prior Art

With the advent in recent years of a laser having a strong output and excellent coherence, it has become possible to produce a light having a wavelength one-half the basic wavelength, by way of second harmonic generation (SHG), with the use of a non-linear optical material.

Typical of the non-linear optical material is a KTiOPO$_4$ single crystal, which is a non-linear optical crystal, referred to hereinafter simply as KTP.

For producing the KTP, there are known a hydrothermal growth method and a top seeded solution growth method (TSSG method). However, in any of these methods, multiple domains are produced on the KTP single crystal produced by growth as a result of polarization.

These multiple domains, if present, give rise to a lowered output and a lowered efficiency of the non-linear optical material in respect of SHG, as described in Appl. Phys. Lett., 51, (1987), 1322.

For overcoming these difficulties, attempts have been made of heat-treating the bulk material or substrates, sliced from a crystal ingot presenting the multiple domains, or applying an electrical field to the bulk material or substrate during the heat treatment for converting the multidomain state into the single domain state. For example, the above-cited literature discloses a poling method of slicing the grown multidomain single crystal in a direction at right angles to the C-axis (polarization axis) to produce a C-plate, forming electrodes on front and reverse sides of the C-plate and applying an electrical voltage across the front and reverse sides of the C-plate heated to about 500° C. to produce a single-domain crystal.

However, these known methods suffer from drawbacks that the single domain crystal can be produced only with difficultly depending on the type of multidomain arrays, such as an array presenting a zigzag-shaped domain wall, the poling process inclusive of an electrode formation is complex and defects produced at the domain boundary tend to remain after poling. As a matter of fact, experiments conducted in converting the multidomain crystal into the single domain crystal by heat treatment and application of the electrical field during the heat treatment have revealed that inversion of polarization cannot be achieved at certain sites and hence a satisfactory single-domain crystal cannot be produced.

OBJECT AND SUMMARY OF THE INVENTION

It is an object of the present invention to provide a method for producing a KTiOPO$_4$ single crystal whereby a grown KTP single crystal can be processed satisfactorily into a single domain crystal to render it possible to grow a high quality crystal having a high SHG efficiency as a non-linear optical material.

In one aspect of the present invention, there is provided a method for producing a KTiOPO$_4$ single crystal comprising contacting a seed crystal with a melt containing a flux, precipitating and growing the KTiOPO$_4$ single crystal at a temperature higher than the Curie temperature of KTiOPO$_4$ maintaining the grown KTiOPO$_4$ single crystal in contact with the melt while maintaining the single crystal at a temperature higher than the Curie temperature, and cooling the KTiOPO$_4$ single crystal to a temperature lower than the Curie temperature while impressing a d.c. current across the seed crystal and the melt.

In another aspect of the present invention, the d.c. current is applied so that the value of a current density D defined by a formula $D = I_p/(a \times b)$, where $I_p$ is the impressed current and a, b are crystal sizes along a and b axes, respectively, with the crystal being grown along a c axis, is $0.01 \text{ mA/cm}^2 \leq D \leq 1.0 \text{ mA/cm}^2$.

The KTP single crystal, grown at a temperature not lower than the Curie temperature, presents a paraelectric phase and is naturally free from polarization.

According to the present invention, an electrical field is applied in this state to the KTP single crystal along the C-axis, by means of a seed crystal and a flux liquid and the KTP single crystal is cooled to a temperature lower than the Curie temperature, so that the grown KTP single crystal proceeds directly to a single domain ferroelectric state without passing through the multidomain state.

By setting the current density D at the time of applying a d.c. voltage across the seed crystal and the flux liquid under cooling the KTP single crystal to $0.01 \leq D \leq 1.0$, it becomes possible to produce a KTP single crystal presenting a satisfactory single domain state.

DETAILED DESCRIPTION OF THE INVENTION

Figure 1:
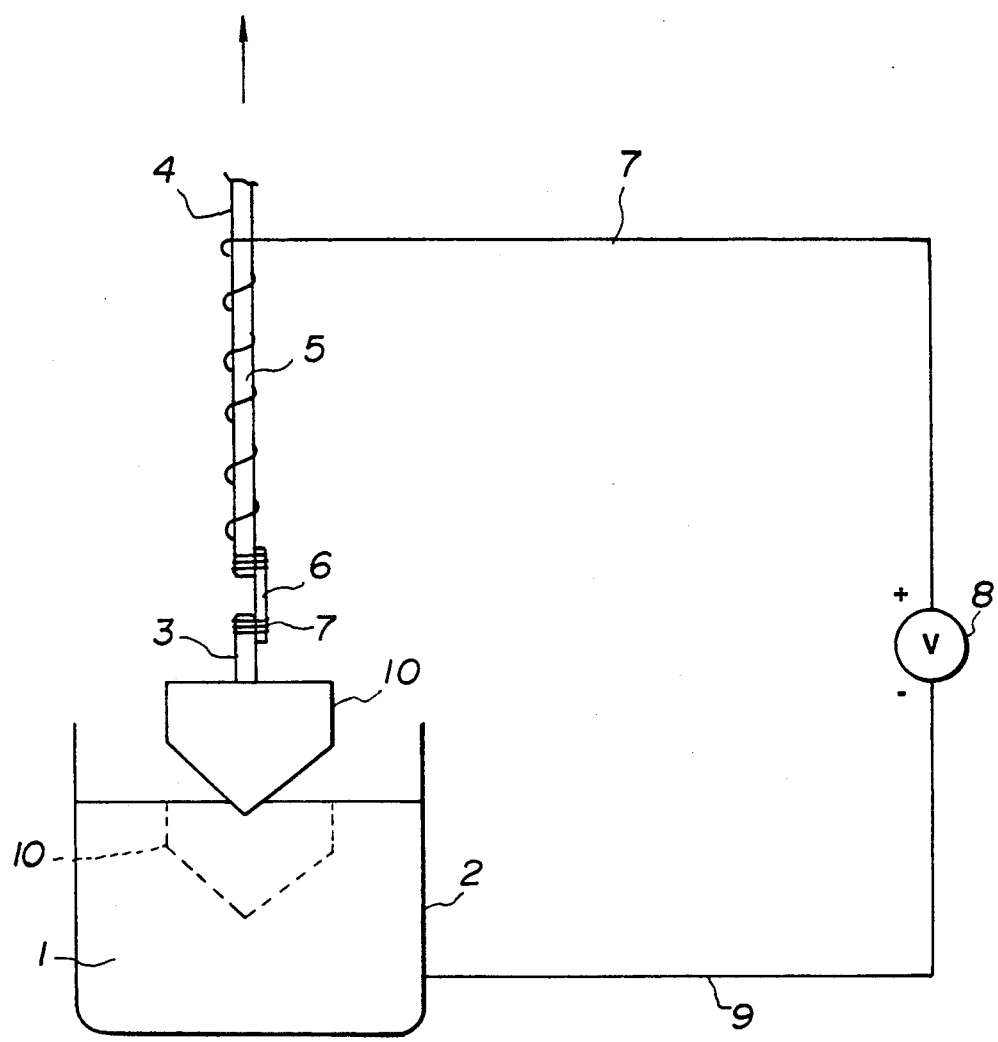
FIG. 1 is a schematic view showing an exemplary device for growing a single crystal employed in carrying out the present invention.

According to the present invention, i KTP single crystal is grown by using a method known as TSSG method.

The TSSG method is one of flux methods and consists in melting a starting material in a flux to produce a supersaturated sate to permit the growth only of a seed crystal with this TSSG method, a larger crystal size may be expected, while the crystal growing direction may be controlled by selecting the orientation of the seed crystal.

The KTP single crystal can be grown under gradual cooling in the flux liquid in the supersaturated state, in accordance with the ordinary TSSG technique. According to the present invention, the ultimate growing temperature of the KTP single crystal is selected to be higher than the Curie temperature of the KTiOPO$_4$, which is approximately 940° C.

Any of the commonly employed starting materials or fluxes may be employed. For example, $3K_2WO_4 \cdot P_2O_5$, $K_6P_4O_{13}$ or $WO_3 + K_6P_4O_{13}$, may be used as flux.

A seed crystal in the form of a rod which has a length of 10 to 15 mm and which has a cross-sectional shape of a square with a side each 2 mm long, and which has the C-axis coincident with its longitudinal direction, is used as a seed crystal.

The KTP single crystal thus grown is maintained in the flux liquid.

Attention should be exercised so that the temperature of the grown single crystal does not become lower than the Curie temperature of $KTiOPO_4$.

According to the present invention, the d.c. voltage is applied in this state from an electric circuit by means of the seed crystal and the flux liquid or melt(crucible) and the KTP single crystal is gradually lowered to a temperature lower than the Curie temperature.

The electric circuit is so set that the d.c. current flowing through the KTP single crystal is a constant current in the range of 0.1 to 5 mA, and that, with the impressed current of Ip and with the crystal sizes along the a-axis and the b-axis of a and b, respectively, with the c-axis as a crystal growing direction, a current density D, as defined by $D = Ip/(a \times b)$, is given by $0.01 \leq D \leq 1.0$ (mA/cm$_2$). If the current density D is less than 0.01 mA/cm$^2$, the effect of current application is lowered and it becomes difficult to produce the single domain crystal, whereas, if the current density D exceeds 1.0 mA/cm$^2$, the KTP single crystal tends to be destroyed.

Although the d.c. voltage may be of a positive or a negative polarity, it is preferred that a positive polarity side be connected to the seed crystal because the KTP single crystal tends to be colored if the negative polarity is connected to the seed crystal. However, such coloration of the KTP single crystal raises no serious problem because the coloration disappears promptly on heating.

Referring to the drawings, a concrete embodiment of the present invention will be explained in detail.

A device for growing a single crystal employed in the present embodiment is shown in FIG. 1 and is composed of a platinum crucible 2 holding a flux liquid or melt 1 of a starting material including a flux and a lifting unit 4 for raising and lowering a seed crystal 3.

The seed crystal 3 employed is a KTP single crystal having a square cross-section (2 mm×2 mm) and a length of 10 to 15 mm, and has its C-direction along a longitudinal direction, shown by Z in FIG. 1.

The lifting unit 4 is adapted to raise or lower a sapphire rod 5 which is 5 mm in diameter and on the distal end of which the seed crystal 3 is attached by means of a platinum rod 6 having the cross-section of a square with each side 3 mm long.

Meanwhile, the seed crystal 3 and the platinum rod 6 are secured to each other by being wrapped by a continuous platinum wire 7 which is simultaneously wrapped around the sapphire rod 5 for connecting the platinum rod to the sapphire rod 5. The platinum wire 7 plays the role of a lead wire for impressing a d.c. voltage to the seed crystal 3.

The platinum wire 7 is connected to the plus side terminal of a d.c. source 8, to the minus side of which is connected a platinum wire 9 which is also connected to an outer wall surface of the platinum crucible 2.

Thus, the d.c. voltage supplied from the d.c. source 8 is impressed across the seed crystal 3 and the flux liquid 1 by means of the platinum crucible 2.

EXAMPLE 1

Using the above-described single crystal growing device, a KTP single crystal was prepared in accordance with the following conditions.

The flux used was $K_6P_4O_{13}$, and the starting material had the following composition in terms of the molar ratio:

| | |
|---|---|
| $KH_2PO_4$ | 0.5 |
| $K_2HPO_4$ | 0.231 |
| $TiO_2$ | 0.269 |

The above flux and starting composition were mixed to give a starting material to flux molar ratio of 0.7:0.3 and melted under heating in a platinum crucible 2. The reaction temperature of the mixture was about 600° C.

The seed crystal 3 attached to the distal end of the lifting unit 4 was immersed in the melt 1 in which the mixture was present in melted state to cause precipitation and growth of the KTP single crystal 10. The precipitation and growth of the single crystal 10 were carried out by gradually cooling the melt 1 at a rate of 0.5° C./hour, with the melt temperatures at the growth start time and at the growth termination time of 1018° C. (crucible temperature of 1033° C.) and 963° C. (crucible temperature of 978° C.), respectively, with the melt temperature at the time of growth termination being higher than the Curie temperature of KTP which is about 940° C. Meanwhile, the following are some of the conditions for growth of single crystals:

| | |
|---|---|
| Rotational Speed of Seed Crystal | 200 rpm |
| Lifting Speed of Seed Crystal | 0 mm/hour |
| Orientation of Seed Crystal | <001> |

When fully grown, the KTP single crystal 10 is immersed in the melt 1, as indicated by a broken line in FIG. 1.

The seed crystal 3 was then lifted by the lifting unit 4 until the KTP single crystal 10 grown around this seed crystal 3 was lifted about 30 mm so that the distal end of the KTP single crystal remained immersed by about 1 mm in the melt 1.

The furnace temperature was maintained at this time so that the KTP single crystal 10 was maintained at a temperature at the time of termination of growth, that is at a temperature higher than the Curie temperature.

The d.c. voltage was applied in this state to the KTP single crystal 10 by means of the melt 1, while the crystal 10 was cooled gradually at a rate of 25° C./hour.

It is noted that, in applying the d.c. voltage, the seed crystal 3 and the melt 1 were connected to the plus and the minus sides of the d.c. source, and the voltage was changed with the temperature so that a constant d.c. current of 1 mA flows through the KTP single crystal 10. In the present example, the voltage was set to 7.5 V and 500 V for the initial temperature of 963° C. and at a time point when the seed crystal 3 was cooled to 800° C., respectively.

The d.c. voltage ceased to be applied at the temperature of the seed crystal lower than 800° C. After the seed crystal was cooled to ambient temperature, the KTP single crystal was washed by dissolving the flux with lukewarm water, it being noted that the KTP single crystal is not dissolved in water. In this manner, the KTP single crystal 10 as shown in FIG. 2 was produced.

Figure 2:
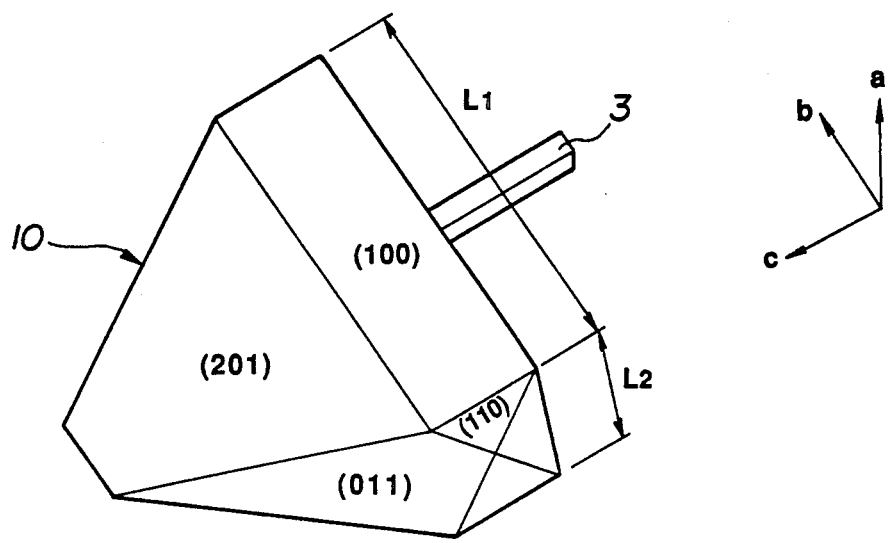
FIG. 2 is a schematic perspective view showing a KTP single crystal prepared in an Example of the present invention.

The orientation of the crystal axes of the KTP single crystal is as shown in FIG. 2, in which spontaneous planes (100), (011), (201) and (110) appeared. The KTP single crystal 10 presented a pointed end with the size of the proximal part being $L_1 \times L_2 = 35$ mm $\times$ 20 mm. The KTP single crystal, prepared by the above-mentioned technique, was sliced, and a sliced piece was etched for observing its domains. It was seen that striped domains were scarcely observed, and domains were observed only at the sites of whiskers.

Conversely, with the KTP single crystal grown by a conventional growing method, that is without application of a d.c. voltage, domains were outstandingly produced on the C-plate with stripe-shaped domain widths of the order of 50 $\mu$m to 0.5 mm mainly parallel to the b-axis.

EXAMPLE 2

In the present example 2, the KTP single crystal was prepared while the operating conditions) such as the current applied to the KTP single crystal while the fully grown KTP single crystal was cooled under application of the d.c. voltage were changed.

In the present Example, the KTP single crystal was grown under the same conditions as those of Example 1, using the above-mentioned single crystal growing method. However, the seed crystal was rotated at a rotational speed of 200 rpm, and the direction of rotation thereof was reversed at an interval of 10 minutes.

The KTP single crystal 10, grown in accordance with the present Example, was maintained in the melt 1 on termination of the crystal growth, as indicated by a broken line in FIG. 1.

Thus, the seed crystal 3 was raised by the seed lifting unit 4 so that the KTP single crystal 10 grown about the seed crystal 3 was lifted by 3 mm so that a major part of the KTP single crystal 10 remained immersed in the melt 1.

The furnace temperature was maintained during this operation so that the KTP single crystal 10 was maintained at the ultimate growth temperature, that is at a temperature higher than the Curie temperature.

A d.c. voltage was applied in this state to the KTP seed crystal 10 by means of the seed crystal 3 and the melt 1, while the crystal was allowed to cool gradually at a rate of 20° C./hour.

It is noted that, in applying the d.c. voltage, the seed crystal 3 and the melt 1 were connected to the plus and the minus sides of the d.c. source, and the voltage was changed with the temperature so that a constant d.c. current of 0.5 mA flows through the KTP single crystal 10. In the present example, the voltage was set to 2 V and 10 V for the initial temperature of 963° C. and at a time point when the seed crystal 3 is cooled to 860° C., respectively.

The d.c. voltage ceased to be applied at the temperature of the seed crystal lower than 860° C. The seed crystal in its entirety was taken out of the melt and held so that the rear end of the crystal was positioned 10 mm above the liquid surface. After the seed crystal was cooled to ambient temperature, the KTP single crystal was washed by dissolving the flux with lukewarm water, it being noted that the KTP single crystal was not dissolved in water. In this manner, the KTP single crystal 10 as shown in FIG. 2 was produced.

The KTP single crystal, prepared by the above-mentioned technique, was sliced, and a sliced piece was etched for observing its domains. It was seen that striped domains were scarcely observed, and domains were observed only at the sites of whiskers.

EXAMPLE 3

In the present Example 3, the KTP single crystal was prepared while the operating conditions, such as the current applied to the KTP single crystal while the fully grown KTP single crystal was cooled under application of the d.c. voltage, were changed.

In the present Example, the KTP single crystal was grown under the same conditions as those of Example 1, using the above-mentioned single crystal growing method. However, the seed crystal was rotated at a rotational speed of 200 rpm and the direction of rotation thereof was reversed at an interval of 10 minutes.

The KTP single crystal 10, grown in accordance with the present Example, was maintained in the melt 1 on termination of the crystal growth, as indicated by a broken line in FIG. 1.

The seed crystal 3 was then raised by the seed lifting unit 4 so that the KTP single crystal 10 grown about the seed crystal 3 was lifted by 1 mm so that a major part of the KTP single crystal 10 remained immersed in the melt 1.

The furnace temperature was maintained during this operation so that the KTP single crystal 10 was maintained at the ultimate growth temperature, that is at a temperature higher than the Curie temperature.

A d.c. voltage was applied in this state to the KTP seed crystal 10 by means of the seed crystal 3 and the melt 1, while the crystal was allowed to cool gradually at a rate of 20° C./hour.

It is noted that, in applying the d.c. voltage, the seed crystal 3 and the melt 1 were connected to the plus and the minus sides of the d.c. source, and the voltage was changed with the temperature so that a constant d.c. current of 0.5 mA flows through the KTP single crystal 10. In the present example, the voltage was set to 2 V and 5 V for the initial temperature of 963° C. and at a time point when the seed crystal 3 was cooled to 860° C., respectively.

The d.c. voltage ceased to be applied at the temperature of the seed crystal lower than 860° C. The seed crystal in its entirety was taken out of the melt and held so that the rear end of the crystal was positioned 10 mm above the liquid surface. After the seed crystal was cooled to ambient temperature, the KTP single crystal was washed by dissolving the flux with lukewarm water, it being noted that the KTP single crystal was not dissolved in water. In this manner, the KTP single crystal 10 as shown in FIG. 2 was produced.

The orientation of the crystal axes of the KTP single crystal is as shown in FIG. 2, in which spontaneous planes (100), (011), (201) and (110) appeared.

The KTP single crystal 10 presented a pointed end with the size of the proximal part being $L_1 \times L_2 = 35$ mm $\times$ 20 mm.

The KTP single crystal, prepared by the above-mentioned technique, was sliced, and a sliced piece was etched for observing its domains. It was seen that striped domains were scarcely observed, and domains were observed only at the sites of whiskers.

EXAMPLE 4

In the present Example 4, the KTP single crystal was prepared while the operating conditions, such as the current applied to the KTP single crystal while the fully grown KTP single crystal was cooled under application of the d.c. voltage, were changed.

In the present Example, the KTP single crystal was grown under the same conditions as those of Example 1, using the above-mentioned single crystal growing method. However, the seed crystal was rotated at a rotational speed of 200 rpm, and the direction of rotation thereof was reversed at an interval of 10 minutes.

The KTP single crystal 10, grown in accordance with the present Example, was maintained in the melt 1 on termination of the crystal growth, as indicated by a broken line in FIG. 1.

Thus, only the seed crystal 3 was raised by the seed lifting unit 4, without lifting the KTP single crystal 10 grown about the seed crystal 3, so that the KTP single crystal 10 remained immersed in the melt 1.

The furnace temperature was maintained during this operation so that the KTP single crystal 10 was maintained at the ultimate growth temperature, that is at a temperature higher than the Curie temperature.

A d.c. voltage was applied in this state to the KTP seed crystal 10 by means of the seed crystal 3 and the melt 1, while the crystal was allowed to cool gradually at a rate of 20° C./hour.

It is noted that, in applying the d.c. voltage, the seed crystal 3 and the melt 1 were connected to the plus and the minus sides of the d.c. source, and the voltage was changed with the temperature so that a constant d.c. current of 0.5 mA flows through the KTP single crystal 10. In the present example, the voltage was set to 1.5 V and 9.3 V for the initial temperature of 963° C. and at a time point when the seed crystal 3 is cooled to 860° C., respectively.

The d.c. voltage ceased to be applied at the temperature of the seed crystal lower than 860° C. The seed crystal in its entirety was taken out of the melt and held so that the rear end of the crystal was positioned 10 mm above the liquid surface. After the seed crystal was cooled to ambient temperature, the KTP single crystal was washed by dissolving the flux with lukewarm water, it being noted that the KTP single crystal is not dissolved in water. In this manner, the KTP single crystal 10 as shown in FIG. 2 was produced.

The KTP single crystal, prepared by the above-mentioned technique, was sliced, and a sliced piece was etched for observing its domains. It was seen that domains were observed only at the site of whiskers, while striped domains were scarcely observed at a midregion. That is, striped domains, each about 100 μm in width, were observed about 1 mm apart from the crystal ends along the a and b axes. However, this is not hindersome because these are unnecessary regions when the crystal is practically used as an element.

EXAMPLE 5

In the present Example 5, a KTP single crystal was prepared by changing the impressed current, after growth of the single crystal, for searching an optimum impressed current and an optimum range of current density at the time of cooling the grown KTP single crystal under application of the d.c. voltage.

The above-mentioned single crystal growing device was similarly employed in the present Example. With the distal end of the grown KTP single crystal 10 immersed by about 1 mm in the melt 1, and with the seed crystal 3 and the melt 1 connected to the positive and negative terminal sides of the d.c. source, respectively, a d.c. voltage was applied to cause a variety of constant d.c. currents to flow through the crystal. As characteristics of the KTP material, if the constant current is caused to flow under gradual cooling, the electrical resistance of the material is increased as the temperature is lowered, so that the impressed voltage is increased. For this reason, the maximum impressed voltage was limited so as not to exceed 1,000 V, in view of power source specifications and by way of dielectric breakdown protection.

A KTP single crystal for the present Example was grown under the following conditions.

As a flux, $K_6O_4O_{13}$ was employed, while the starting material having the following composition in molar ratio was employed:

| | |
|---|---|
| $KH_2PO_4$ | 0.5 |
| $KH_2PO_4$ | 0.242 |
| $TiO_2$ | 0.285 |

The above flux and starting composition were mixed to give a starting material to flux molar ratio of 0.0680:0.258 and melted under heating in a platinum crucible 2. The reaction temperature of the mixture was about 600° C.

The seed crystal 3 attached to the distal end of the lifting unit 4 was immersed in the melt 1 in which the mixture is melted to cause precipitation and growth of the KTP single crystal 10. The precipitation and growth of the single crystal 10 were carried out by gradually cooling the melt 1 at a rate of 0.24° C./hour. Meanwhile, the following are some of the conditions for growth of single crystals:

| | |
|---|---|
| Rotational Velocity of Seed Crystal | 200 rpm |
| Lifting Speed of Seed Crystal | 0 mm/hour |
| Orientation of Seed Crystal | <001> |

If the lengths of the KTP single crystal along a, b and c axes, with the growing direction being along the c axis, are a, b and c, respectively, the maximum size of the crystal grown by the above technique was $a \times b \times c = 20 \times 35 \times 20$ m.

The KTP single crystal 10, thus grown about the seed crystal 3, was lifted by about 30 mm, so that the distal end of the KTP single crystal 10 remained immersed in the melt 1 by about 1 mm.

The furnace temperature was maintained at this time so that the KTP crystal 10 was maintained at the ultimate growth temperature higher than the Curie temperature.

A variety of d.c. voltages were applied to the KTP single crystal 10, by means of the seed crystal 3 and the melt 1, while the crystal was gradually cooled to 860° C., at a rate of 20° C./hour, to produce KTP single crystal samples 1 to 7.

It is noted that, in applying the d.c. voltage, the seed crystal 3 and the melt 1 were connected to the plus and the minus sides of the d.c. source, respectively, and the voltage was changed with the temperature so that a constant d.c. current proper to each sample flows through the KTP single crystal 10. The impressed current Ip (mA), which is the constant d.c. current employed for producing each sample, the current density D, a crucible temperature $T_s$ at the growth start time, a crucible temperature $T_e$ at a growth termination time and a voltage $V_s$ across the seed crystal and the platinum crucible, are shown in Table 1. The current density D is given by $D=Ip/(a+b)$, where Ip is the impressed current and a and b are crystal sizes along the a and b axes, with the crystal being grown along the c axis.

TABLE 1

| SAMPLE No | Ip (mA) | D (mA/cm) | Ts (°C.) | Te (°C.) | Vs (V) |
|---|---|---|---|---|---|
| 1 | 20.0 | 3.3 | 1015 | 982 | — |
| 2 | 5.0 | 0.996 | 1015 | 982 | 7.3 |
| 3 | 3.0 | 1.017 | 1015 | 982 | — |
| 4 | 2.0 | 0.28 | 1015 | 982 | 177.9 |
| 5 | 1.0 | 0.012 | 1016 | 982 | 7.5 |
| 6 | 0.1 | 0.071 | 1017 | 982 | 0.2 |
| 7 | 0.05 | 0.007 | 1015 | 982 | 0.1 |

Of the KTP single crystal samples, prepared by the above-described technique, the sample No.1 having Ip larger than 5 mA (Ip=20.0 mA) was broken due to crack caused by the impressed voltage. Besides, the larger the impressed current $I_p$, the more the seed crystal tended to be white in color. The KTP single crystal samples 2 to 7 were then sliced, and a sliced piece was etched for observing its domain. It was seen that the sample, No.7 having Ip=0.05 mA was processed only incompletely into a single-domain crystal, whereas the remaining samples were substantially free from striped domains except those observed at the site of whiskers. It was thus seen that the samples prepared under the conditions of the current density D between 0.01 and 1.0 mA/cm² could be processed satisfactorily into single domain crystals. It was thus found that the optimum range of the density D of the current which is impressed during cooling of the grown KTP single crystal for processing the single crystal into a single domain crystal is $0.01 \leq D \leq 1.0$.

Figure 3:
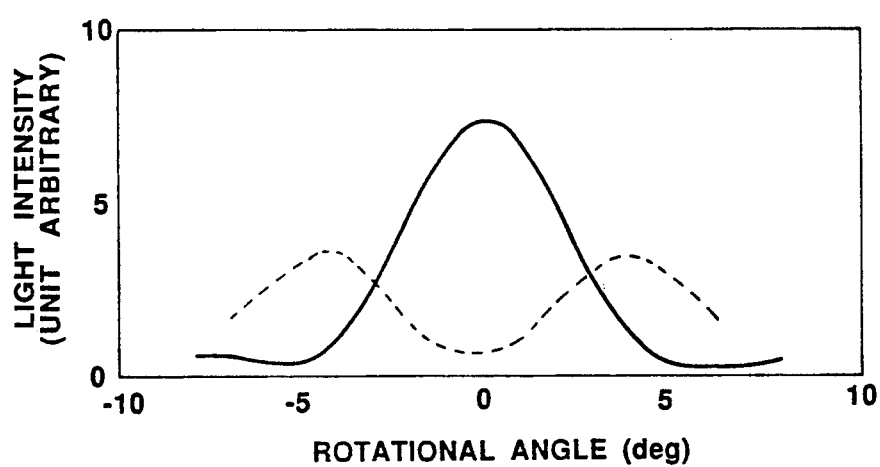
FIG. 3 is a graph showing the difference in SHG characteristics caused by the presence or absence of application of a d.c. voltage.

Scrutiny into SHG characteristics of the KTP single crystals, prepared under application of the d.c. voltage in the above Examples 1 to 5, indicated that the crystals were processed completely into single domain crystals, each exhibiting only one peak of light intensity. FIG. 3 shows SHG characteristics of the KTP single crystal of Example 1 prepared by application of the d.c. voltage and those of the KTP single crystal prepared without application of the d.c. voltage. FIG. 3 indicates that the KTP single crystal of Example 1 prepared by application of the d.c. voltage was completely processed into a single domain crystal exhibiting only one peak of light intensity, as shown by a solid line in FIG. 3, whereas the KTP single crystal prepared without application of the d.c. voltage exhibited two distinct peaks of light intensity, thus showing that the crystal was in the multidomain state.

Meanwhile, the SHG characteristics were measured with the sample thickness of about 2.5 mm, a YAG input of 100 mill, a YAG input wavelength of 1,064 nm and an SHG output of 532 nm, and the SHG output of the order of μm were measured by a photomultiplier.

It should be understood that various changes and modifications of the presently preferred embodiments described herein will be apparent to those skilled in the art. Such changes and modifications can be made without departing from the spirit and scope of the present invention and without diminishing its attendant advantages. It is, therefore, intended that such changes and modifications be covered by the appended claims.

What is claimed is:

1. A method for producing a KTiOPO₄ single crystal comprising the steps of: contacting a seed crystal with a melt containing a flux, precipitating and growing the KTiOPO₄ single crystal at a temperature higher than the Curie Temperature of KTiOPO₄, maintaining the grown KTiOPO₄ single crystal in contact with said melt while maintaining said single crystal at a temperature higher than the Curie temperature of KTiOPO₄, and cooling said KTiOPO₄ single crystal to a temperature lower than the Curie temperature of KTiOPO₄ while impressing a d.c. current across said seed crystal and said melt.

2. The method for producing the KTiOPO₄ single crystal as defined in claim 1 wherein only the vicinity of a distal end of the grown KTiOPO₄ single crystal is maintained in contact with the melt.

3. The method for producing the KTiOPO₄ single crystal as defined in claim 1 wherein a rod-shaped crystal having its longitudinal direction coincident with the c axis direction is used as the seed crystal and the KTiOPO₄ single crystal is grown along the c axis.

4. The method for producing the KTiOPO₄ single crystal as defined in claim 1 wherein the d.c. current is applied so that the value of a current density D defined by a formula $D=Ip/(a \times b)$, where Ip is the impressed current and a, b are crystal sizes along a and b axes, respectively, with the crystal being grown along a c axis, is 0.01 mA/cm² $\leq D \leq$ 1.0 mA/cm².

5. The method for producing the KTiOPO₄ single crystal as defined in claim 1 wherein the d.c. current is applied with the seed crystal and the melt being connected to a plus side and a minus side of a d.c. source, respectively.

6. The method for producing the KTiOPO₄ 4 single crystal as defined in claim 1 wherein the melt is K₆P₄O₁₃.

* * * * *